United States Patent
Ho et al.

(10) Patent No.: US 7,915,758 B2
(45) Date of Patent: Mar. 29, 2011

(54) PRINTED CIRCUIT BOARD AND METHOD FOR DETERMINING AN OPTIMIZATION POINT FOR SENSING A VOLTAGE REGULATOR MODULE ON A PRINTED CIRCUIT BOARD

(75) Inventors: Duen-Yi Ho, Taipei Hsien (TW); Shou-Kuo Hsu, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 218 days.

(21) Appl. No.: 12/257,367

(22) Filed: Oct. 23, 2008

(65) Prior Publication Data

US 2010/0052422 A1    Mar. 4, 2010

(30) Foreign Application Priority Data

Aug. 29, 2008  (CN) .......................... 2008 1 0304298

(51) Int. Cl.
    *H02J 3/12*        (2006.01)
(52) U.S. Cl. .......................................... 307/32

(58) Field of Classification Search .................... 307/32, 307/69; 323/234, 285, 267, 268
See application file for complete search history.

(56) References Cited

U.S. PATENT DOCUMENTS

| | | | |
|---|---|---|---|
| 7,355,371 B2 * | 4/2008 | Chao et al. | 323/267 |
| 7,420,351 B2 * | 9/2008 | Grbovic | 318/772 |
| 7,554,821 B1 * | 6/2009 | Collmeyer et al. | 363/21.13 |
| 7,589,519 B2 * | 9/2009 | Park | 324/158.1 |
| 7,622,824 B2 * | 11/2009 | Orr et al. | 307/69 |
| 7,694,163 B1 * | 4/2010 | Bisbee | 713/340 |

* cited by examiner

*Primary Examiner* — Albert W Paladini
(74) *Attorney, Agent, or Firm* — Zhigang Ma

(57) ABSTRACT

A print circuit board (PCB) includes a voltage regulator module (VRM), a plurality of loads, and a sense location for augmenting the voltage margin of the loads. The VRM is configured for charging the loads. Each load has a weight. The voltage value of the sense location equals to a summation of a corresponding weight value of a corresponding load multiplied by a corresponding voltage value of the load, for each of the plurality of loads on the PCB. An optimization method for the sense location on the PCB is also provided.

8 Claims, 3 Drawing Sheets

PRINTED CIRCUIT BOARD AND METHOD FOR DETERMINING AN OPTIMIZATION POINT FOR SENSING A VOLTAGE REGULATOR MODULE ON A PRINTED CIRCUIT BOARD

BACKGROUND

1. Field of the Invention

The present invention relates to a printed circuit board (PCB), and particularly to a method for determining an optimization point for sensing a voltage regulator module on the PCB.

2. Description of Related Art

PCBs have played an important role in electrical production. Generally, a PCB can have a number of voltage regulator modules (VRMs) for charging one or more loads on the PCB. PCB designers need to sense a voltage at a point near the VRM to feedback the voltage of the VRM, for making the VRM supplies the correct voltage for the loads. A voltage at the point equals to a voltage of the corresponding VRM. The point for sensing the VRM further acts as a mirror voltage source of the corresponding VRM, which affects voltage distribution on the PCB, and charges one or more loads on the PCB. The point affects performance of the corresponding VRM. An appropriate point for sensing the voltage of the VRM can augment voltage margins of the loads. PCB designers generally determine a point for sensing the voltage of a VRM manually, which generally cannot improve a performance of the corresponding VRM, and cannot augment the voltage margin of the loads.

What is needed, therefore, is a PCB and a method for determining an optimization point for sensing a VRM on the PCB that can amend the aforementioned deficiency.

DETAILED DESCRIPTION

Figure 1:
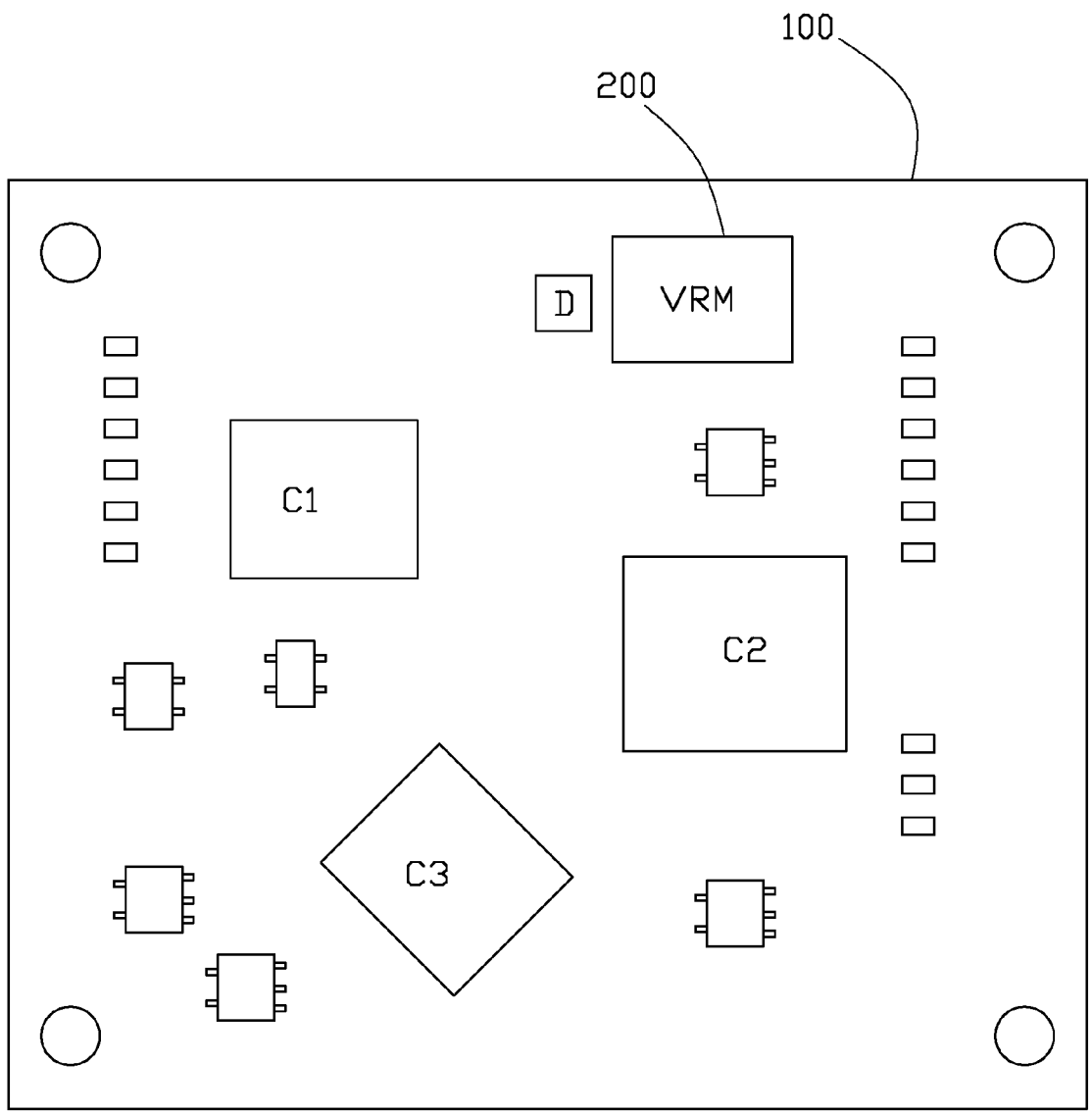
FIG. 1 is a schematic diagram of a PCB built in a simulation environment.
Figure 2:
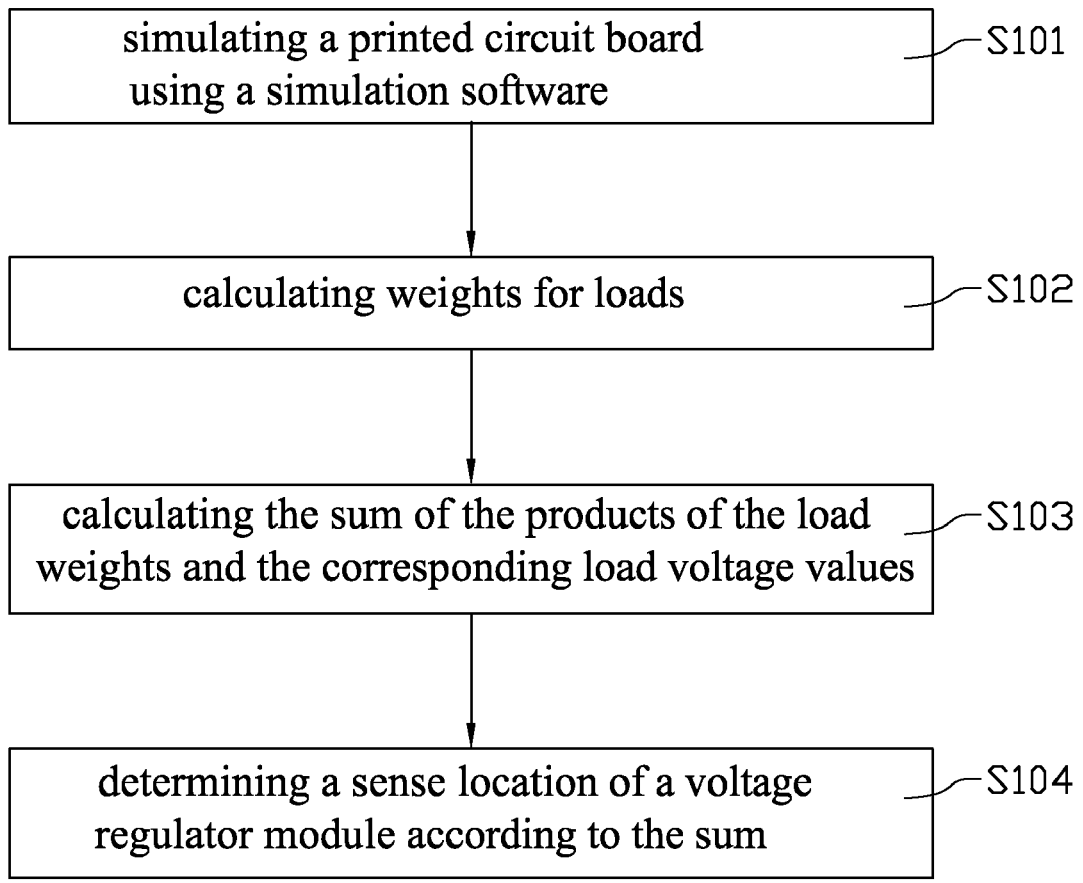
FIG. 2 is a flowchart of an exemplary method for determining an optimization point for sensing a VRM on a PCB.

Referring to FIGS. 1-2, an exemplary method for determining an optimization point for sensing a VRM on a printed circuit board (PCB) may include following blocks. Depending on the embodiment, additional blocks may be added, others deleted, and the ordering of the blocks may be changed.

In block S101, a layout of a PCB 100 may be simulated using a simulation software. A detailed explanation of one exemplary embodiment of determining an optimization point for sensing a voltage regulator module (VRM) on the PCB 100 is detailed below. However, it may be understood that the embodiment is exemplary and may be used for other PCBs with different configurations. In the illustrated embodiment, the PCB 100 includes a VRM 200, and three loads C1, C2, and C3, such as a resistor, capacitor, inductor, and/or transistor, for example. The point for sensing the VRM 200 is marked as "D" in FIG. 1. The voltage of the VRM 200 is 1.5 volts (V) in one exemplary embodiment. The initialization position of point D for sensing the VRM 200 can be arbitrary. In one embodiment, the point D is positioned adjacent to the VRM 200, however, the location of the point D is not limited thereto. An output voltage scope of the VRM 200 ranges from about 1.425V to about 1.575 V in one exemplary embodiment. The VRM 200 provides voltage for the loads C1, C2, and C3, and sets the voltage value of the point D as about 1.5V. Parameters I1, I2, and I3 act as current values of the loads C1, C2, and C3 respectively. Parameters V1, V2, and V3 act as voltage values of the loads C1, C2, and C3 respectively. Afterwards, the current values I1, I2, and I3 are set as about 2.6 amperes (A), about 9.6 A and about 2.38 A respectively, the voltage values V1, V2, and V3 are equal to about 1.4697V, about 1.4599V, and about 1.4595V respectively. Therefore, a voltage margin of the load C1 is a difference between the voltage value V1 and the least voltage value 1.425V of the VRM 200, i.e. about 44.7 millivolts (mV). A voltage margin of the load C2 is a difference between the voltage value V2 and the least voltage value about 1.425V of the VRM 200, i.e. about 34.9 mV. A voltage margin of the load C3 is a difference between the voltage value V3 and the least voltage value about 1.425V of the VRM 200, i.e. about 34.5 mV.

In block S102, weight values for the loads C1, C2, and C3 are calculated according to a weighted average method. In one embodiment, normalization values of the load current values I1, I2, and I3 are set as the corresponding load weight values which are calculated as follows:

$$W1 = \frac{I1}{I1 + I2 + I3} \quad (1)$$

$$W2 = \frac{I2}{I1 + I2 + I3} \quad (2)$$

$$W3 = \frac{I3}{I1 + I2 + I3} \quad (3)$$

wherein W1 is the weight value for the load C1, W2 is the weight value for the load C2, and W3 is the weight value for the load C3. Thus, when the current value I1 equals to about 2.6 A, the current value I2 equals to about 9.6 A, and the current value I3 equals to about 2.38 A, the weight value W1 is about 0.18, the weight value W2 is about 0.66, and the weight value W3 is about 0.16.

In block S103, the summation of the load weight values W1, W2, and W3 multiply the corresponding load voltage values V1, V2, and V3 respectively is calculated. In one embodiment, the calculation can be denoted as follows:

$$VD = W1*V1 + W2*V2 + W3*V3 \quad (4)$$

wherein VD is a voltage value at an optimal point which is for sensing the VRM 200 on the PCB 100. Thus, the voltage value VD equals to about 1.46V based on the voltage values V1, V2, V3, and the weight values W1, W2, and W3 described above. All points with the voltage value 1.46V on the PCB 100 can be set as the optimal points for sensing the VRM 200, and form a distributing area for the optimal points for sensing the VRM 200.

In block S104, an optimal point for sensing the VRM 200 in the distributing area is determined based on the layout convenience and feasibility. The VRM 200 sets the voltage value at the optimal point as 1.5V, which changes voltage distribution on the PCB 100. The voltage value V1 of the load C1 becomes about 1.5062V The voltage value V2 of the load C2 becomes about 1.4963V. The voltage value V3 of the load C3 becomes about 1.4959V. Therefore, the voltage margin of the load C1 becomes a difference between the new voltage value V1 and the most voltage value about 1.575V of the VRM 200, i.e. about 68.8 mV. The voltage margin of the load C2 becomes a difference between the new voltage value V2 and the least voltage value about 1.425V of the VRM 200, i.e.

about 71.3 mV. The voltage margin of the load C3 becomes a difference between the new voltage value V3 and the least voltage value about 1.425V of the VRM 200, i.e. about 70.9 mV. It can be seen that the voltage margins of the loads C1, C2, and C3 can be augmented by the exemplary optimization method.

Figure 3:
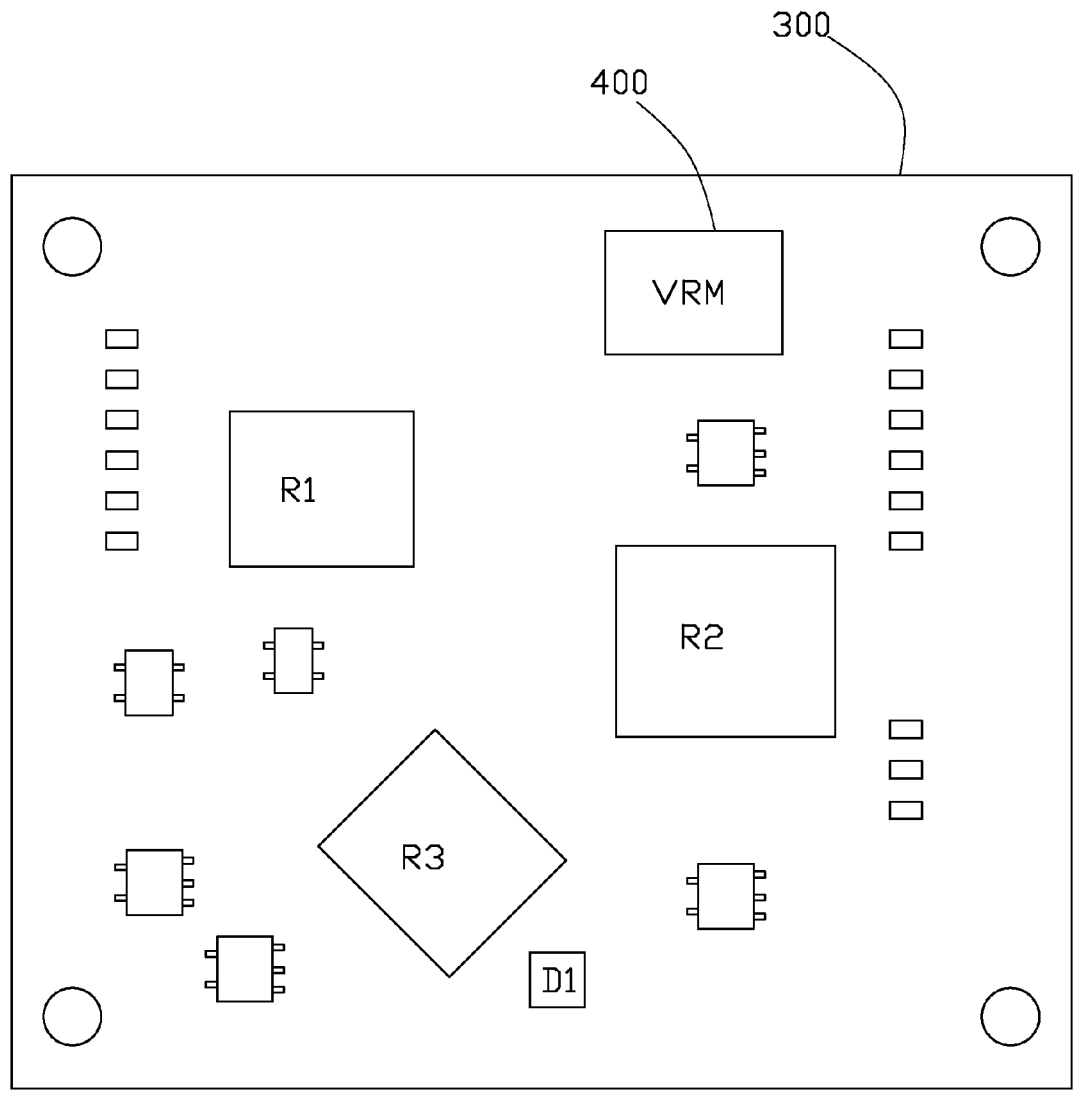
FIG. 3 is a schematic diagram of an exemplary PCB.

Applying the above-mentioned exemplary optimization method on a PCB 300 as shown in FIG. 3, wherein the optimal point for sensing the VRM 200 is D1. The position of D1 is chosen because the voltage of this point is the voltage value VD (1.46V) based on the voltage values V1, V2, V3, and the weight values W1, W2, and W3. The PCB 300 includes a VRM 400, and three loads R1, R2, and R3. The point D1 is located far from the VRM 400 however the point D1 may be located on other positions of the PCB 100 depending on the voltage value VD (1.46V), layout convenience, and feasibility. The VRM 400 provides voltage for the loads R1, R2, and R3, and sets the voltage value at the point D1 as about 1.5V may be understood that the voltage value about 1.5V at the point is because the voltage of the VRM 400 is about 1.5V. After determining the point for sensing the VRM 200, the voltage at the point is set as the voltage of the VRM to change voltage distribution on the PCB 300 and augment the voltage margins of the loads. That is to say, the point for sensing the VRM further acts as a mirror voltage source of the VRM 400.

It is be understood that the VRM 400 of the PCB 300 can also be other types of direct current sources or alternating current sources, and the number of loads can also be adjusted. The weight values W1, W2, and W3 can be determined by other types of weighted average methods. For example, the weight values W1, W2, and W3 are square normalization values of the current values I1, I2, and I3, which can be denoted as follows:

$$W1 = \frac{I1 * I1}{I1*I1 + I2*I2 + I3*I3} \quad (5)$$

$$W2 = \frac{I2 * I2}{I1*I1 + I2*I2 + I3*I3} \quad (6)$$

$$W3 = \frac{I3 * I3}{I1*I1 + I2*I2 + I3*I3} \quad (7)$$

or, are simple average values of the number of the loads, which can be denoted as follows:

$$W1 = W2 = W3 = \frac{1}{n} \quad (8)$$

wherein, n is the number of the loads.

The foregoing description of the certain inventive embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skill in the art to which the present disclosure pertains without departing from its spirit and scope. Accordingly, the scope of the present disclosure is defined by the appended claims rather than the foregoing description and the embodiments described therein.

What is claimed is:

1. A printed circuit board (PCB), comprising:
   a plurality of loads;
   a voltage regulator module (VRM) for providing voltage for each of the plurality of loads; and
   a point for sensing the VRM for each of the plurality of loads;
   wherein each load from the plurality of loads has a weight value based on current values of the plurality of loads or the number of the plurality of loads, wherein a voltage value at the point for sensing the VRM equals to a summation of a corresponding weight value of a corresponding load multiplied by a corresponding voltage value of the corresponding load, for each of the plurality of loads on the PCB.

2. The PCB of claim 1, wherein the corresponding weight value of the corresponding load equals to a current value of the corresponding load divided by a sum of current values of each of the plurality of loads.

3. The PCB of claim 1, wherein the corresponding weight value of the corresponding load equals to a current square value of the corresponding load divided by a sum of current square values of each of the plurality of loads.

4. The PCB of claim 1, wherein the corresponding weight value of the corresponding load equals to one divided by the number of the plurality of loads.

5. A method for determining an optimization point for sensing a voltage regulator module (VRM) on a printed circuit board (PCB), comprising of:
   obtaining voltage values for one or more loads based on current values of the one or more loads on the PCB;
   calculating weight values for the one or more loads based on the current values of the one or more loads on the PCB or the number of the one or more loads;
   calculating a summation of a corresponding weight value of a corresponding load multiplied by a corresponding voltage value of the corresponding load, for each of the one or more loads on the PCB; and
   determining the optimization point for sensing the VRM on the PCB according to the summation.

6. The method of claim 5, wherein calculating a current value of the corresponding load is divided by a sum of current values of each of the one or more of loads as the corresponding weight value of the corresponding load.

7. The method of claim 5, wherein calculating a current square value of the corresponding load divided by a sum of current square values of each of one or more loads as the corresponding weight value of the corresponding load.

8. The method of claim 5, wherein calculating one divided by the number of the one or more loads as the corresponding weight value of the corresponding load.

* * * * *